United States Patent [19]
Owen

[11] Patent Number: 5,974,362
[45] Date of Patent: Oct. 26, 1999

[54] SIGNAL GENERATOR FOR TESTING RADIO FREQUENCY COMPONENTS

[75] Inventor: David P Owen, Dunstable, United Kingdom

[73] Assignee: Marconi Instruments Limited, United Kingdom

[21] Appl. No.: 08/749,918

[22] Filed: Nov. 14, 1996

[30] Foreign Application Priority Data

Nov. 24, 1995 [GB] United Kingdom .................. 9524107

[51] Int. Cl.⁶ ................................................ H03B 21/00
[52] U.S. Cl. .......................... 702/107; 702/106; 331/42; 331/48
[58] Field of Search .................................. 702/106, 107, 702/69; 364/717.01, 717.02, 717.07; 370/252, 335; 455/108, 67.3; 331/40, 42, 48, 49

[56] References Cited

U.S. PATENT DOCUMENTS

| | | | |
|---|---|---|---|
| 3,631,346 | 12/1971 | Riggs .................................... | 324/76.14 |
| 4,028,622 | 6/1977 | Evans et al. ........................... | 455/67.3 |
| 4,078,255 | 3/1978 | Evans ................................... | 364/717.07 |
| 4,206,421 | 6/1980 | Bernhard et al. ........................ | 331/42 |
| 4,414,639 | 11/1983 | Talambiras . | |
| 4,516,085 | 5/1985 | Effinger et al. ......................... | 331/42 |
| 4,580,111 | 4/1986 | Swanson ................................. | 455/108 |
| 4,782,392 | 11/1988 | Haycock et al. ......................... | 348/594 |
| 5,675,581 | 10/1997 | Soliman ................................ | 370/252 |

FOREIGN PATENT DOCUMENTS

| | | |
|---|---|---|
| 2 037 513 | 7/1980 | United Kingdom . |
| 2 128 048 | 4/1984 | United Kingdom . |
| WO 84/00648 | 2/1984 | WIPO . |

*Primary Examiner*—John Barlow
*Assistant Examiner*—Bryan Bui
*Attorney, Agent, or Firm*—Kirschstein, et al

[57] ABSTRACT

A signal generator comprises a number of independent signal sources each of which can be controlled to generate predetermined frequencies and modulation. The outputs of these signal sources can be made available separately at output ports or can be combined within the signal generator to provide a combined output signal. The output signals are sensed at the output ports, and are calibrated against a stored correction tabulation to ensure that they have the correct signal level at the output ports. Such a signal generator is useful for the measurement and testing of complex electrical and electronic products.

19 Claims, 11 Drawing Sheets

SIGNAL GENERATOR FOR TESTING RADIO FREQUENCY COMPONENTS

BACKGROUND OF THE INVENTION

This invention relates to signal generators, and is particularly applicable to signal generators which are intended to perform measurements and tests. Such instruments are required to produce an output signal having precisely specified characteristics, such as carrier frequency, modulation depth or power level. It is particularly important to achieve and maintain specified levels of precision when testing RF components or systems.

Increasingly the devices under test require the use of more than one signal generator in order to carry out a test which simulates typical operating conditions. At present, this kind of requirement is met by the use of a number of independent signal generators, the output signals of which are adjusted so as to have the desired relationship with each other. Not only can this be time consuming, it can also be difficult to achieve the required degree of accuracy, and to maintain that accuracy over a period of time.

For example, two or three tone intermodulation measurements on amplifiers need to be carried out where an amplifier, such as those used in cable television systems, is required to amplify two or more signals. All amplifiers introduce some distortion to the signals and when two or more signals are being used the non linearities cause the generation of spurious signals at other frequencies. These signals can be highly undesirable since they can cause interference to users at other frequencies. If, for instance, an amplifier is passing signals at 600 MHz and 610 MHz, then the spurious signals are generated primarily at frequencies of 590 MHz and 620 MHz and users of these frequencies would experience interference.

FIG. 1 shows how an amplifier can be tested using RF signal generators. Two (or more) signal generator outputs are combined together to produce RF signals with equal levels. The signals are then passed through the amplifier and the output spectrum is monitored by a suitable signal analyzer to measure the spurious signals relative to the wanted signals.

Another example of where two or more signal generators are required, is in the testing of an RF mixer, which is a device which can be used to change the frequency of a signal. If an input signal of, for instance 600 MHz is applied to the RF port of the mixer and a local oscillator of, for instance 610 MHz is applied to the LO port, it will produce signals at the sum (1210 MHz) and the difference (10 MHz) frequencies. The output can then be filtered to remove unwanted signals. In this example, if only the difference frequency is required, the signal could be put through a low pass filter to remove any oscillator breakthrough signals and the sum component.

Frequency converters on communication system are often required to work with input signals which have more than one principal component. In this example, the mixer could be required to convert two signals, 610 MHz and 611 MHz, to a frequency of 10 MHz and 11 MHz respectively. As with testing amplifiers, however, the mixer is not perfectly linear and this non linearity will result in the generation of intermodulation signals at 9 MHz and 12 MHz on the IF output.

FIG. 2 shows how signal generators can be used to test a mixer to check its intermodulation performance. One signal generator is used to provide the local oscillator signal to drive the mixer. The second and third signal generator outputs are combined in a suitable summing network and the combined output signal is applied to the RF port of the mixer. The output of the mixer is then measured using a suitable signal analyzer to measure the intermodulation products generated in the mixer.

Receivers in communications systems have to be able to receive weak transmitted signals when other stronger transmitters being received. An example of this is that receivers operating in the avionics bands above 108 MHz must be able to work when much more powerful signals from FM broadcast transmitters that are close by. The ability of a receiver to reject these signals and still receive the wanted signal is a measure of the selectivity (or blocking ratio) of the receiver. The measurement is usually quoted as the relative signal level of the unwanted signal compared to the wanted signal when the receiver is meeting a specified performance criteria (e.g. signal to noise ratio or bit error rate).

The selectivity can be measured as shown in FIG. 3. Two signal generator outputs are combined in a suitable summing network and the output is applied to the input of the receiver. The signal level of the first signal generator is set at a low RF level with a modulated carrier so that the receiver is operating with, for instance, an 18 dB signal to noise ratio. The interfering signal is then set to a frequency at which it is necessary to check the selectivity and the level is increased until the receiver performance degrades to, for instance, 12 dB. The difference in levels between the two signals at the receiver input is the selectivity of the receiver.

There are many other applications for signal generators which require the use of more than one signal generator to undertake a test. However, the use of separate signal generators, external cables and combining networks combined with the voltage standing wave ratio or VSWR or of the components and the signal generators can generate significant errors in the measurement which the user has to allow for. In addition, different applications require that the signal generators are physically connected together in different ways in order to undertake the test. The different test applications also require that the signal generator parameters need to interact with each in different ways according to the test being carried. In the case of intermodulation, for instance, the two signals need to always have the same RF level and frequency difference, while selectivity measurements require the frequency separation and the level of the interferer relative to the in-channel signal to be variable. This can require that parameters on both signal generators need adjusting and the interaction is dependent on the test application.

SUMMARY OF THE INVENTION

The present invention seeks to provide an improved signal generator in which these requirements such as these can be met more readily.

According to a first aspect of this invention, a signal generator includes a plurality of adjustable frequency signal sources mounted within a common enclosure; a combiner; and at least two switches such that the signals from at least two of said signal sources can be directly routed to respective output ports, or can be combined and made available at a combiner output port, and calibration means within said enclosure for controlling the levels of the signals at said output ports.

According to a second aspect of this invention, a signal generator includes a plurality of adjustable frequency signal sources mounted within a common enclosure; and a control system adapted to cause generation of output signals at at least two output ports having a predetermined frequency and/or level relationship with each other, and wherein the input of data to the control system relating to the characteristics of one output signal also causes the setting up of the other output signal.

BRIEF DESCRIPTION OF THE DRAWINGS

The invention is further described by way of example with reference to the accompanying drawings, in which.

DETAILED DESCRIPTION OF THE PREFERRED EMBODIMENTS

Figure 1:
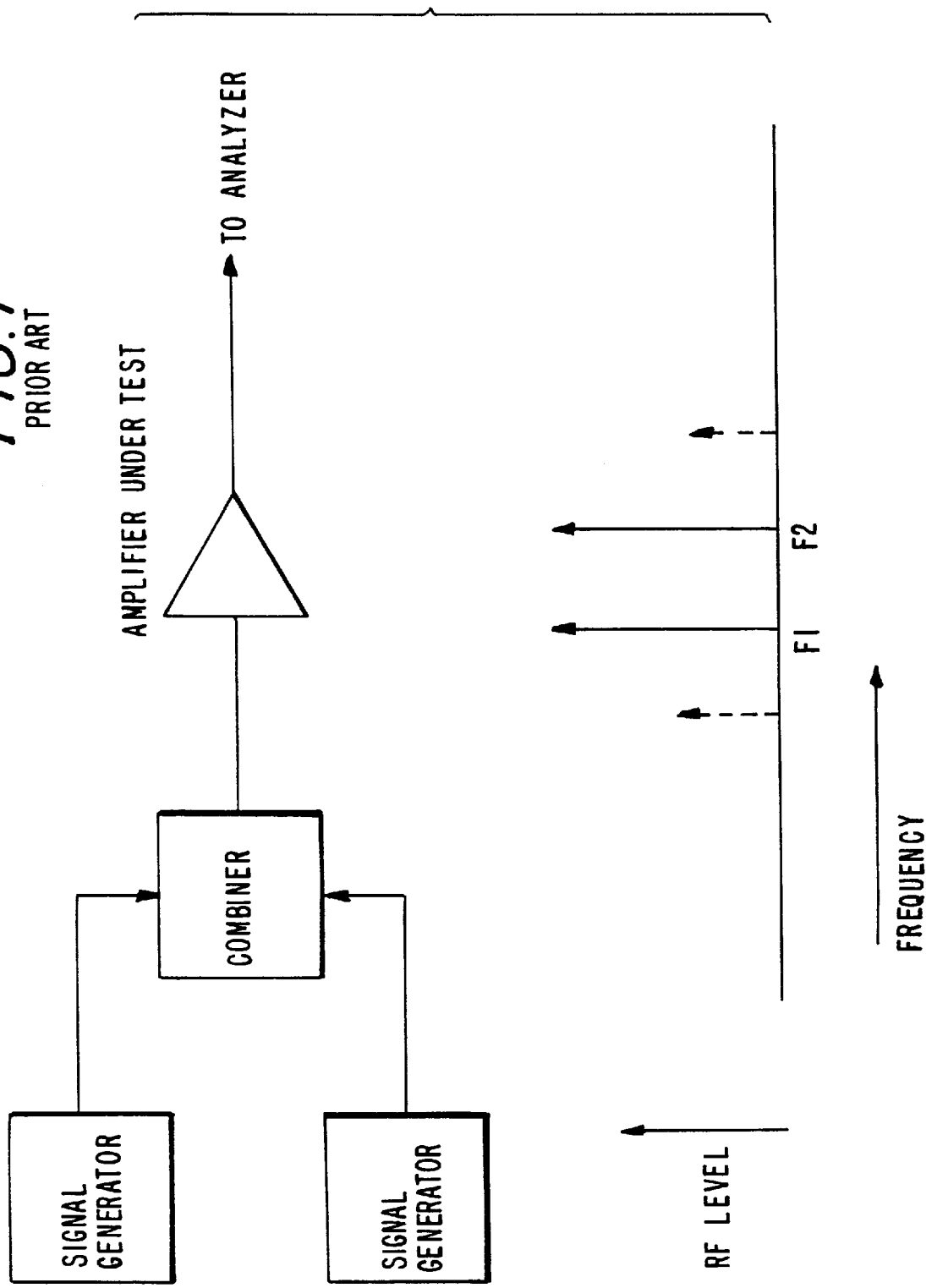
FIGS. 1–3 are block diagrams of testing circuits according to the prior art as discussed above.
Figure 2:
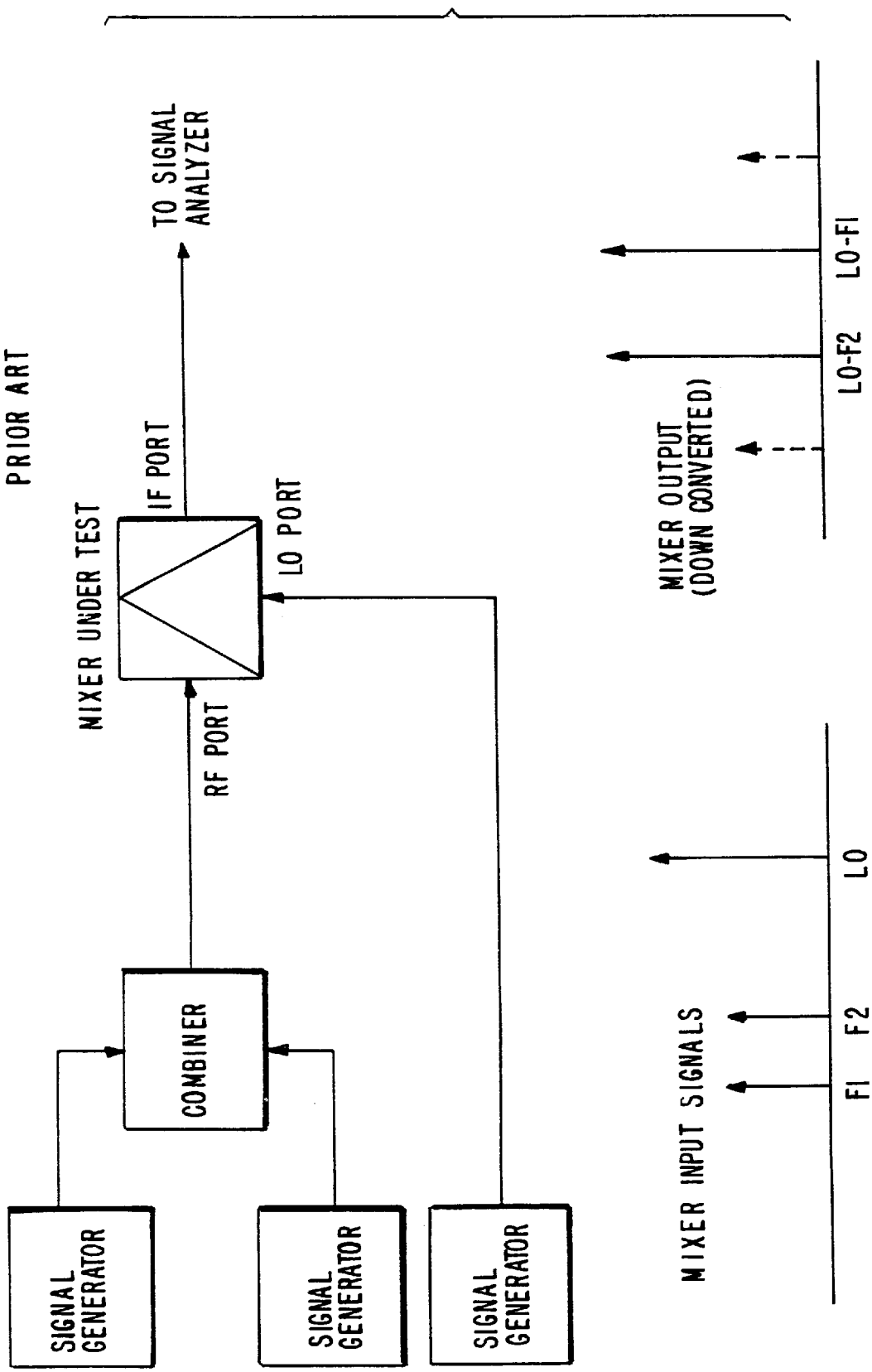
Figure 3:
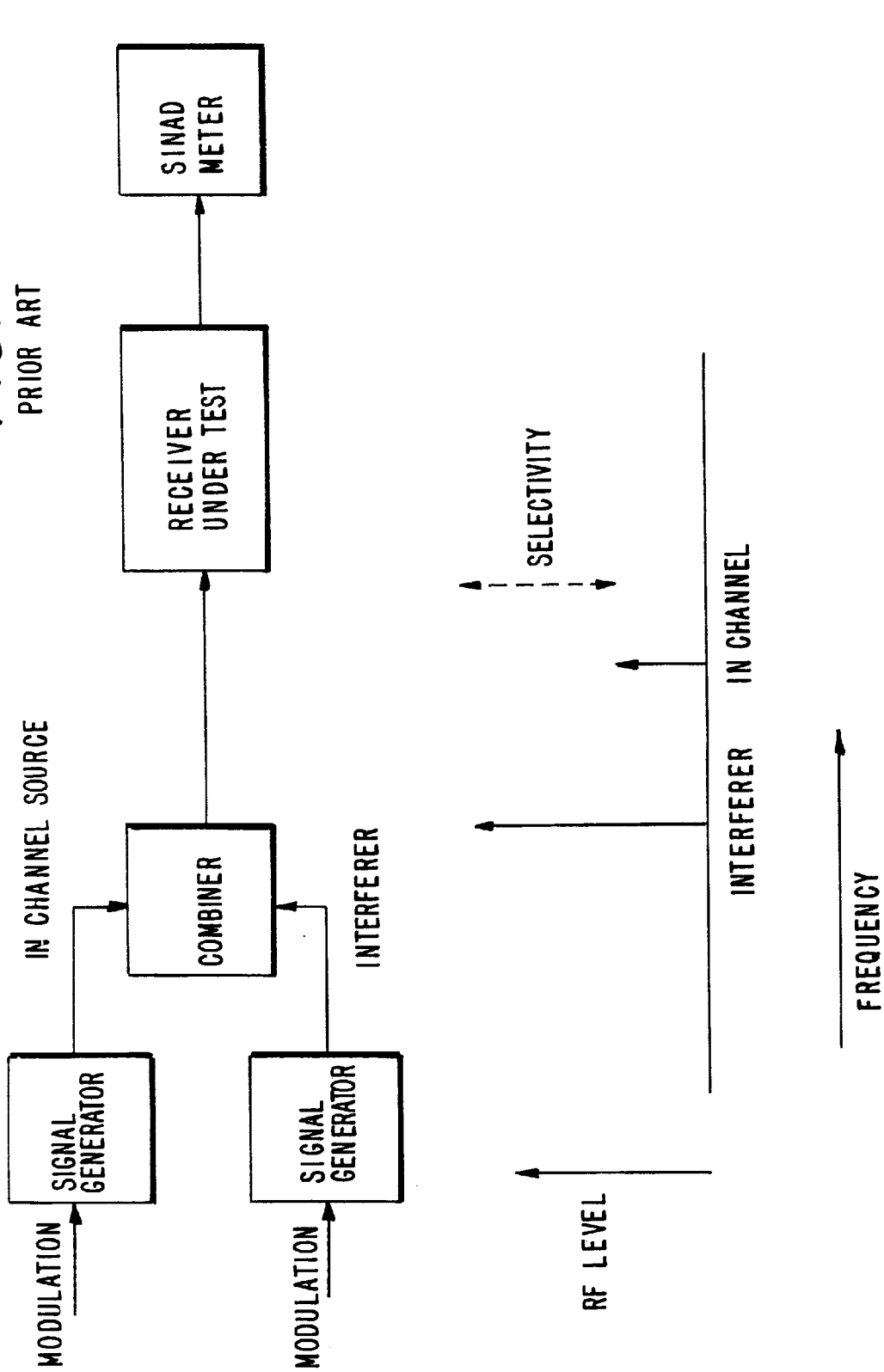
Figure 4:
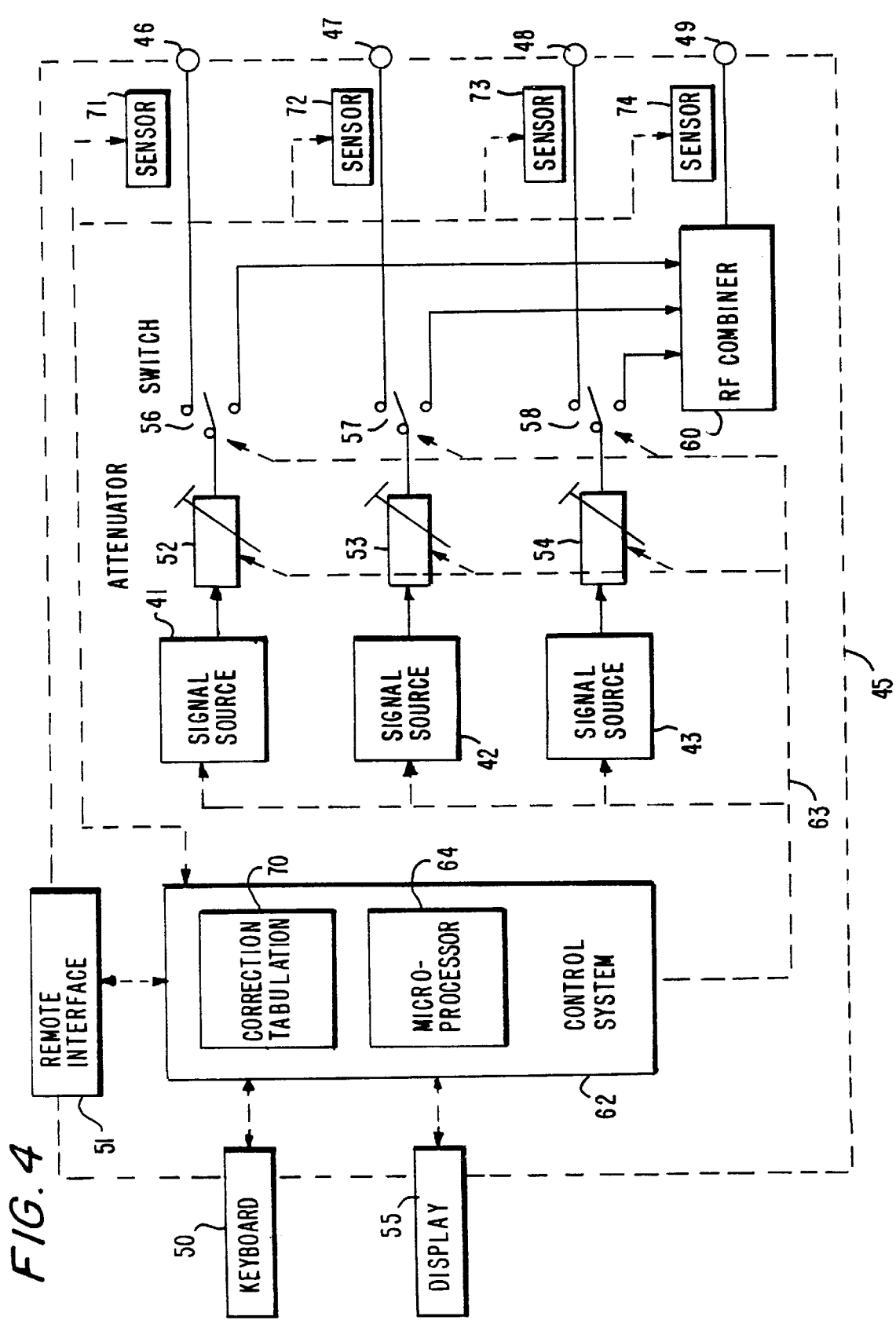
FIG. 4 illustrates in diagrammatic form an improved signal generator according to the invention.

Referring to FIG. 4, the signal generator includes three signal sources 41, 42, 43, mounted within a common mechanical enclosure or housing 45, which has four output ports 46, 47, 48, 49. The operation of the signal generator can be controlled via a keyboard 50 or a remote control interface 51 operating via an external data bus, for example, in accordance with the GPIB or RS232 standards, with information concerning its operation being presented to an operator via a display 55. Each signal source 41, 42, 43 has a modulation source (not separately shown) associated with it.

Each signal source 41 to 43 is connected via an adjustable RF step attenuator 52 to 54 and an RF switch 56 to 58 to a respective one of the output ports 46 to 48. A step attenuator is a variable attenuator whose attenuation is alterable in discrete predetermined values. By means of a respective switch 56, 57 or 58, each signal source can instead be switchably connected to an RF combiner network 60, the output of which is connected to a further output port 49. The RF switches are of the kind which terminate the unused signal route with a matching load impedance to minimize unwanted signal reflections. A further port 59 is provided on the housing 45, and this permits an external signal to be routed to the combiner. This allows a further signal generator (which may be the same as that shown in FIG. 4, or it may be of a different type, e.g., lower noise, digital modulation, etc.).

A control system 62 which is linked to the interface 51, the keyboard 50 and the display 55 is used to control the settings of the signal sources 41 to 43, the attenuators 52 to 54, the switches 56 to 58 and the combiner 60 via a data bus 63. The control system 62 includes a microprocessor 64 which enables the control system to respond to input commands from the keyboard and the remote interface by generating the appropriate data for transmission over the data bus 63.

Each signal source 41 to 43 is operative as a signal generator in its own right and is independently capable of generating modulated carrier signals to allow tests on communications systems and the like. As required, the modulation may be angle, frequency or phase modulation. The arrangement allows the user to define a configuration where RF signals are available on individual output ports and a composite signal is also available on the combiner output port 49.

The amplitude of the signals generated by each of the signal sources 41 to 43 is controllable electronically using an automatic level system of the kind commonly included in a signal generator. The step RF attenuators 52 to 54 are used to extend the power range available, and each attenuator can be a mechanical step attenuator system, a solid state (e.g. FET switches) attenuator or a combination of these two types, or of any other suitable type. Mechanical attenuators have the advantage of generally being less susceptible to the generation of their own intermodulation products. The attenuator allows each signal generator output to be varied over a large RF range and therefore allows the levels or RF signals at the input to the combiner to be significantly different to each other. The attenuators also serve to minimize the backfire from other signal sources being applied to the combiner which in turn minimizes the creation of intermodulation products in the signal source's output amplifier and detector. In principle, the switch arrangement could be replaced by a splitter system to route a portion of the signal to the individual output ports 46 to 48 and a portion to the combiner output 49. However, this solution has the disadvantage that it reduces the maximum RF level available from the individual outputs (because of splitter loss) and switches are still required to turn off signals to the unused output ports.

The signal generator output frequencies can cover a wide variety of carrier frequencies and the cables, switches and combiner networks will exhibit frequency dependent loss characteristics. Without correction this would cause unsatisfactory errors in the measurement of key parameters involving RF level dependent characteristics. To correct for the frequency dependent level errors, the control system 62 comprises a microprocessor control system which includes a tabulation 70 of the path losses when the signal is routed to the individual connectors and to the summed connector for each of the signal generators. When the user selects a particular configuration the microprocessor 64 uses the relevant correction table to adjust the RF level from the signal generator to provide the requested level at the specified RF connector.

Typically this correction tabulation 70 is created when the instrument is manufactured, and interpolation between calibration points is used to minimize the size of the correction data while maintaining good correction capability. However, if the microprocessor 64 has a suitable controller capability, a power meter, operating externally from a GPIB or RS 232 interface or an internal power sensor, is used to measure the RF level. With an internal program an automatic calibration routine can be supported. In FIG. 4 such power sensors 71 to 74 are shown adjacent to respective output ports 46 to 49, and the signals which are sensed are fed back to the control system 62. These signals can be used in real time to adjust the level of the signals produced by the signal sources 52 to 54, or they can be used to update the tabulation.

Many of the test applications for such an instrument require that the individual settings of each generator are coupled together. If for instance two tone intermodulation measurements are being performed then two signal sources need to be set to the same power levels. Instead of the user having to separately enter the RF levels, the control system 62 can be set up so that both signal levels are controlled by one data entry. The signal generator allows different methods of achieving this.

Figure 5:
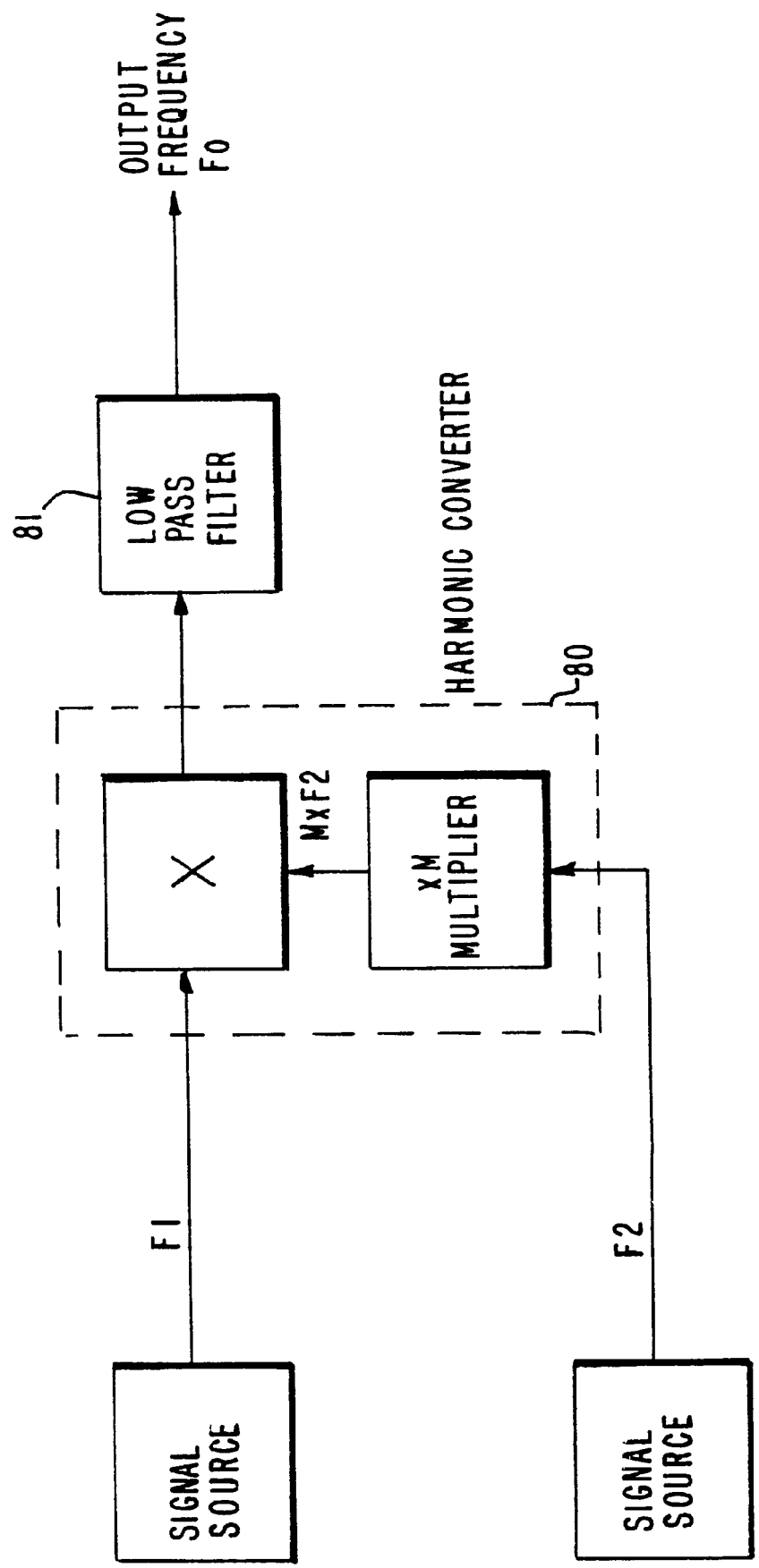
FIGS. 5 to 11 are explanatory diagrams relating to its modes of operation.

One method is to provide a mechanism whereby two parameters can be coupled together. In the above example a facility is provided which allows RF levels and frequencies to be coupled together by defining a relationship between them. Typically the relationship can be that the two signals can be unrelated (separate), equal or offset from each other. In addition for carrier frequencies the relationship can specify that they are harmonically related (e.g. $F_1=2*F_2$) or harmonically related and offset (e.g. $F_1=2*F_2+N$ where N is the offset value). This relationship can be used when testing an harmonic down converter 80 to ensure that the output frequency from the converter is always fixed—an example of a suitable configuration is shown in FIG. 5, in which the output is supplied via a low pass filter 81. With reference to this figure, the output frequency $F_0$, typically is held at a fixed value as the input frequencies $F_1$ and $F_2$ are varied. Where three signal sources are used then two sets of coupling factors can be defined (e.g. $F_1$ to $F_2$ and $F_1$ to $F_3$).

Figure 6:
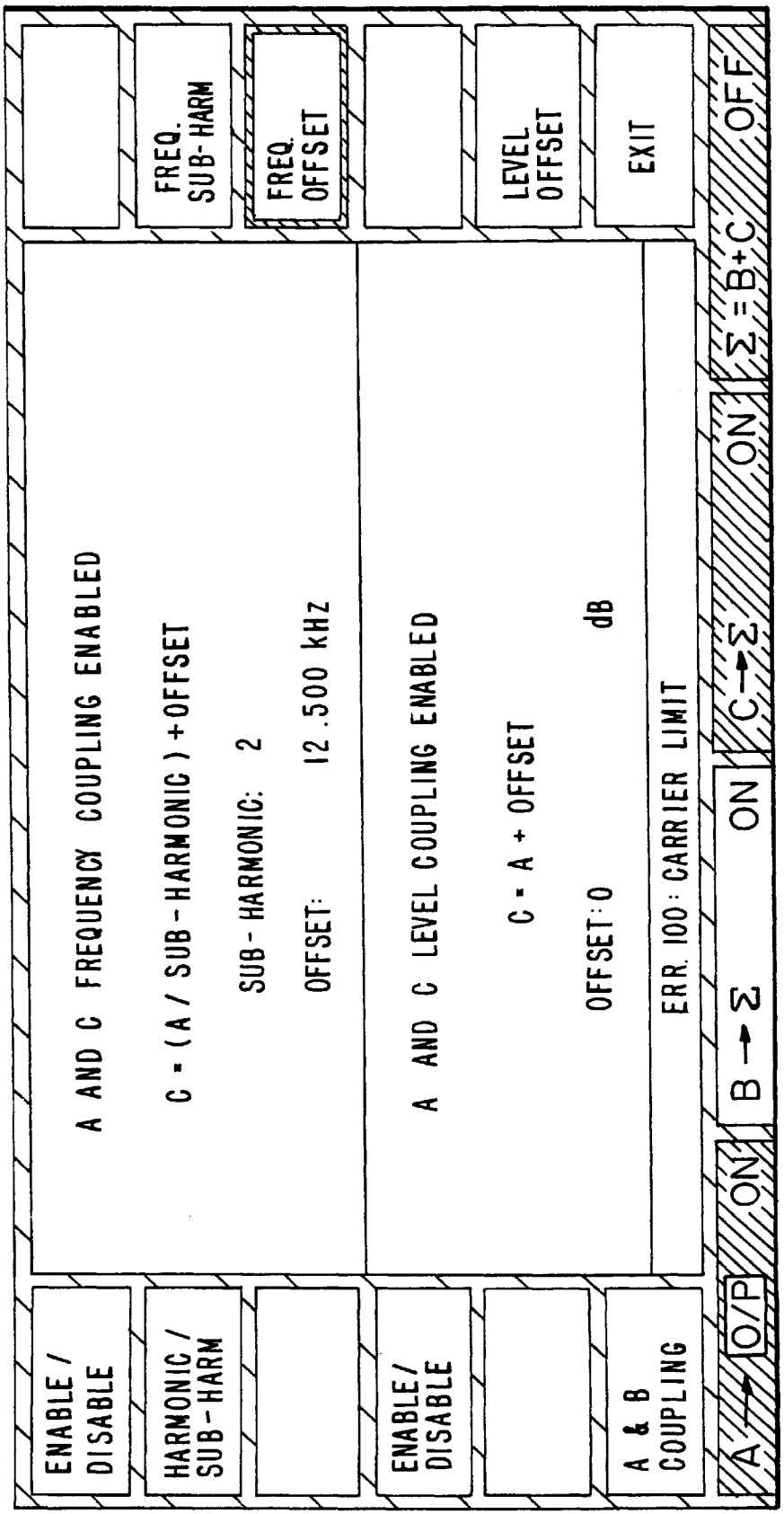

An example of how to set up relationships between signal sources is shown in FIG. 6. In this example, a signal generator uses a LCD panel as display and includes soft keys (keys whose function varies according to the mode of operation) down the right and left side of the display. The soft keys can be operated either using a touch panel or using mechanical keys aligned with the soft keys. FIG. 6 shows how the required formulas can be entered to set the characteristcs of a signal generator B and C referenced to a signal generator by selecting the appropriate soft key and entering the relationship.

Figure 7:
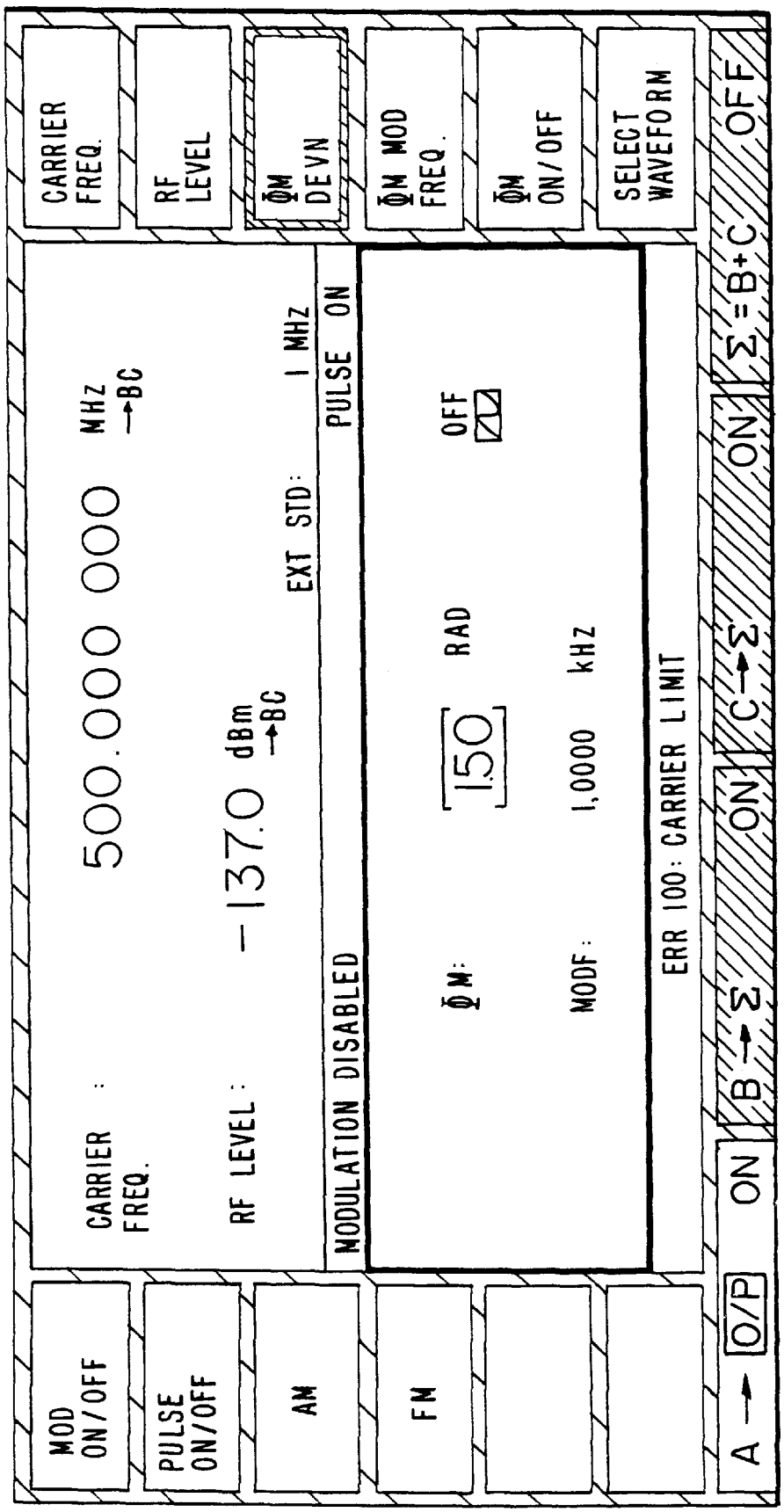
Figure 8:
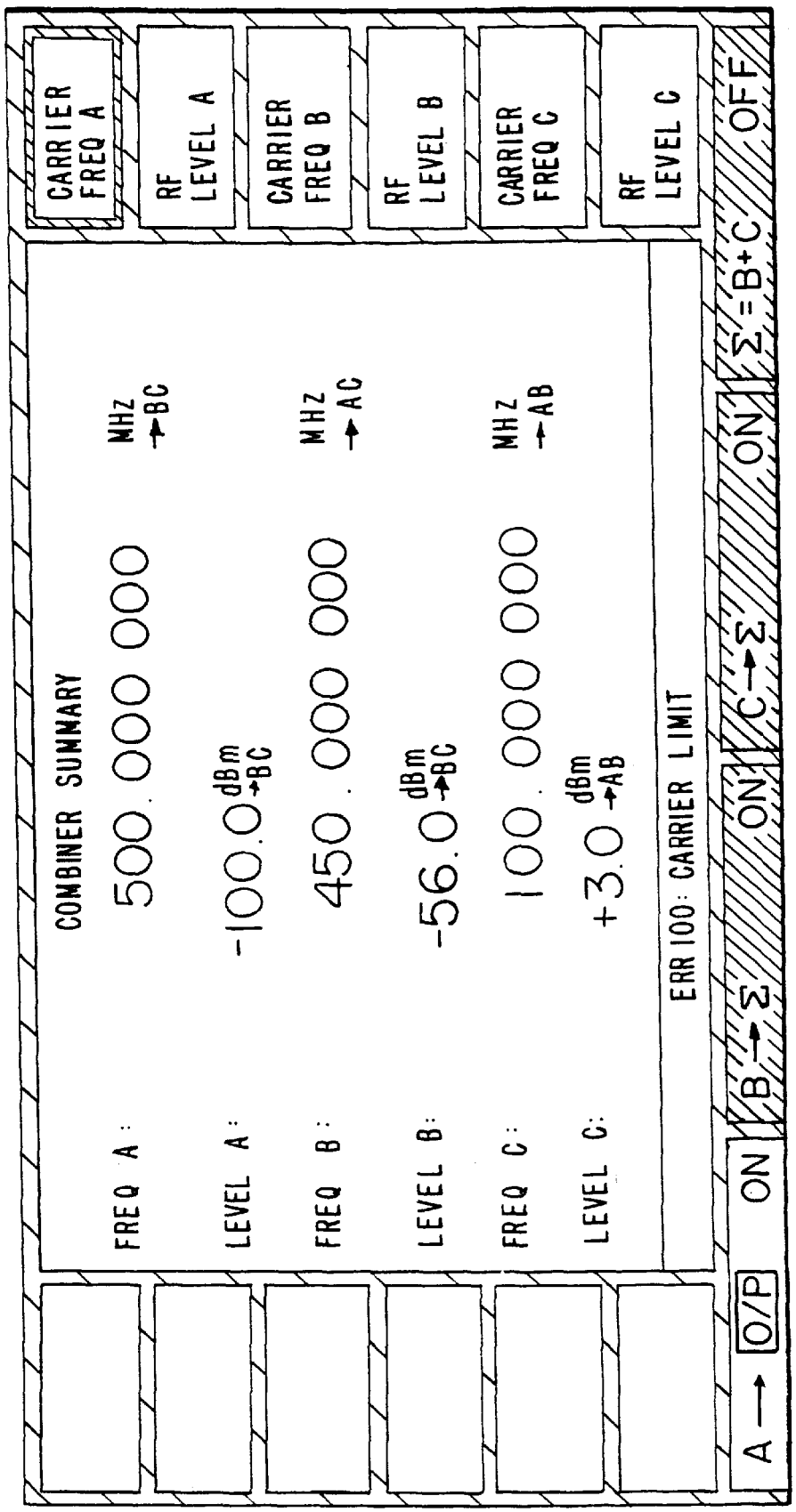

Once a relationship has been entered then changing the frequency of sources A, for instance, can change the frequency of source B or C. It is desirable to ensure that users are aware of this interaction. For this reason, a preferred solution of the invention uses a display system which has an Icon indicating that a relationship has been set up. FIG. 7 shows a solution to how to use an Icon to display the relationship. In this example, the display is showing the setting of signal source A which has relationships established to the RF frequency and level of the signals of the signal source B and the signal source C. To indicate that a relationship has been set up on a given parameter the symbol ⇒BC is added under the terminator symbols (MHz and dBm) to indicate the relationship is enabled. In a similar way a user may wish to have a summary of the settings of all the sources level frequency and a user interface can be provided which displays these parameters with the Icon to indicate a relationship as shown in FIG. 8.

Figure 9:
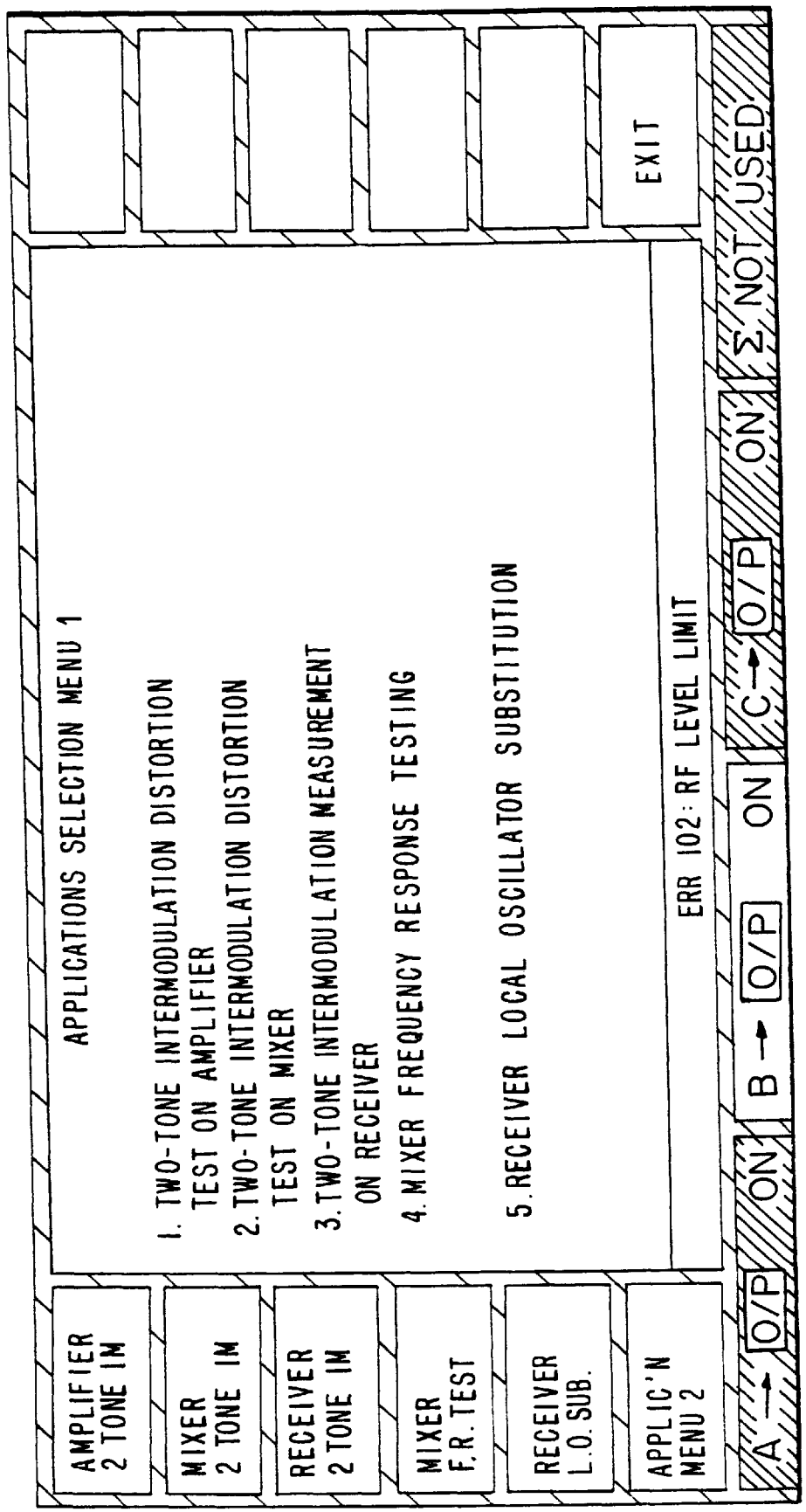

A second method of controlling the signal generators is to provided a man machine interface which supports the specific test that is required to be carried out. In this case the presentation of the man machine interface is changed to reflect the test application. Examples of typical test applications are shown in FIG. 9, in which a particular application is selected by means of the appropriate soft key at the left side of the display. If, for example, a two tone intermodulation test is to be performed the instrument automatically selects a routing system where two signal generators are routed to the combiner 60. In addition the method of entering information is changed; in this example a single RF level (which controls both RF levels), one of the frequencies and the separation frequency between the two signals are entered into the control system 62.

Figure 10:
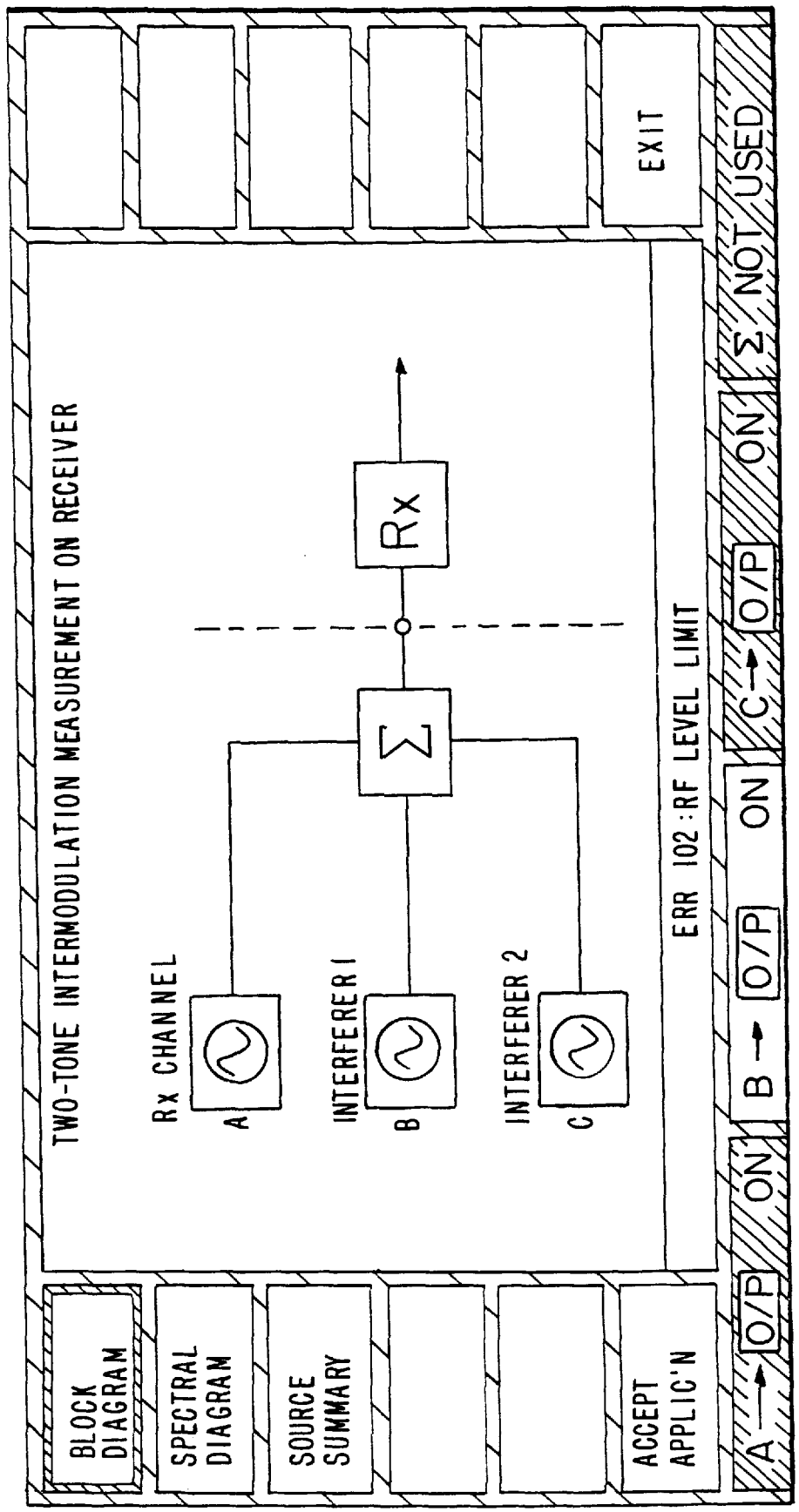
Figure 11:
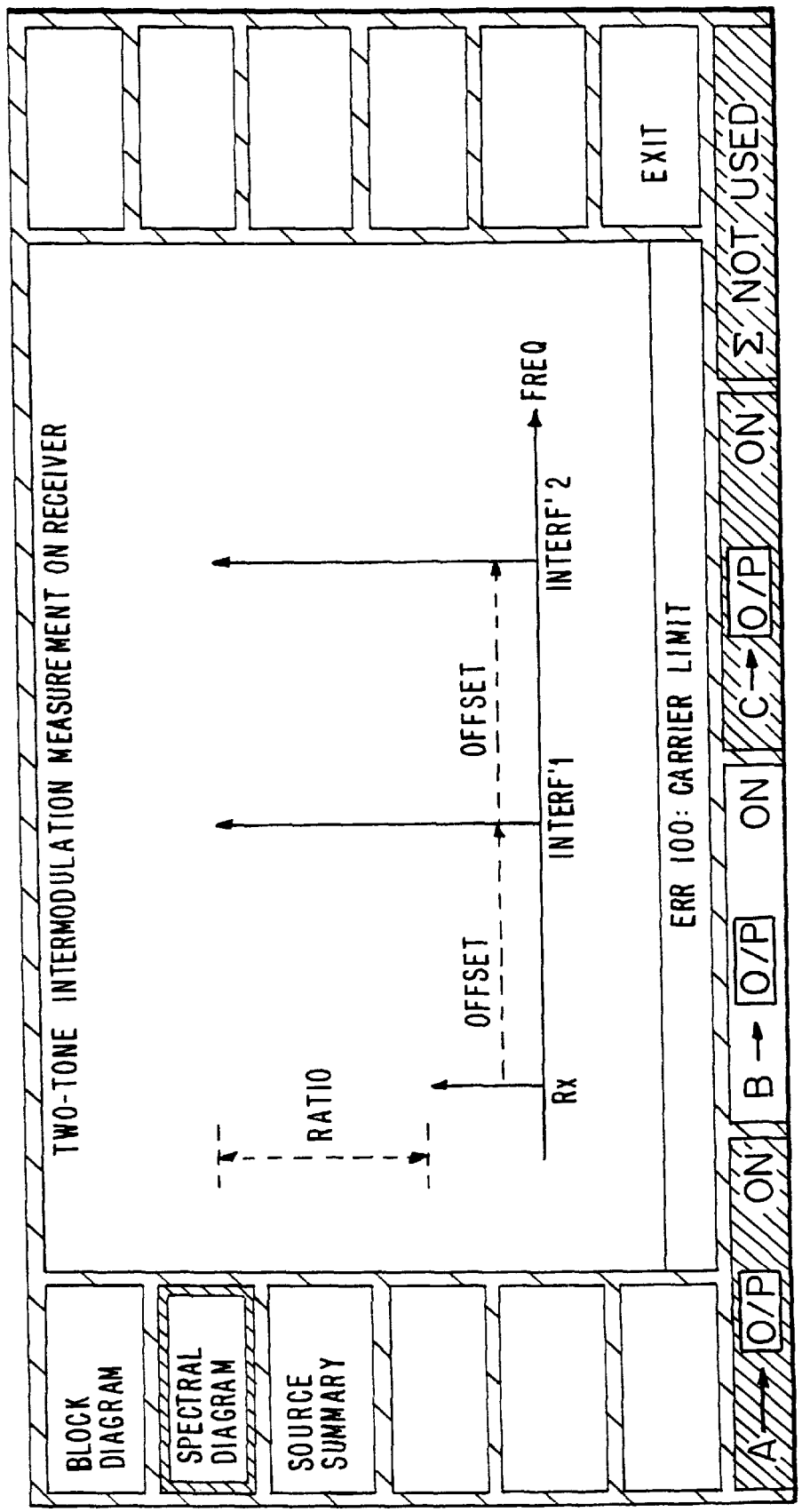

In a preferred embodiment of the invention the user interface can provide information about the routing system and the parameters used to control the application in a graphical format. If an application, such as two tone intermodulation on a receiver, is selected the application can be displayed in a block diagram form, as shown in FIG. 10, to show the routing of the signal generators. A similar facility can also be provided to show how the signal sources are routed when the application mode is not being used. The entry parameters can be displayed in graphical form, typically as shown in FIG. 11, in which the spectral relationships are shown. In the case of two tone intermodulation testing on a receiver the parameters to be entered are the Receiver frequency, interferer offset frequency and the relative RF level.

In the example of the selectivity measurement the instrument would again automatically route two signals to the combiner, but the parameters which are entered into the control system are the RF level and frequency of the in-channel (wanted) signal, the frequency separation (from the in-channel signal) and the relative level (compared to the in-channel signal).

In the case of measuring mixer intermodulation the control system automatically routes two outputs to the output port of the combiner and one to a separate output port.

The advantage of providing this application-orientated man-machine interface is that the measurements are presented in the way that they are described and defined (in engineering terminology) and the instrument automatically sets up the signal generator routing and parameter interaction. This minimizes the chances of operator errors which could otherwise lead to misleading results. The microprocessor 64 is arranged to respond, for example, to man-machine instructions entered via the keyboard 50 in order to modify the procedures for setting up the characteristics of the signal generator in dependence on the kind of test required. Appropriate instructions are fed back to a user via the display 55 as the setting-up procedure progresses.

I claim:

1. A signal generator comprising a plurality of adjustable frequency signal sources mounted within a common enclosure; a combiner; and at least two switches such that the signals from at least two of said signal sources can be directly routed to respective output ports; or can be combined and made available at a combiner output port, and calibration means within said enclosure for controlling the levels of the signals at said output ports.

2. A signal generator as claimed in claim 1 and wherein a variable attenuator is associated with the output signal of each signal source.

3. A signal generator as claimed in claim 2 and wherein each variable attenuator is interposed between a respective signal source and a said switch.

4. A signal generator as claimed in claim 2 and wherein said variable attenuators are step attenuators.

5. A signal generator as claimed in claim 1 and wherein each of said switches is of the kind which is operable to route an incoming signal to one of two output paths, with the non-selected output path being provided with a matched load impedance.

6. A signal generator as claimed in claim 1 and wherein a control system is provided to determine the signal frequency and level which is made available to each of the output ports in response to input data.

7. A signal generator as claimed in claim 6 and wherein said calibration means includes a tabulation which is accessible to said control system, and which is utilized by said control system in setting the levels of the signals provided by said signal sources.

8. A signal generator as claimed in claim 7 and wherein said tabulation includes data representative of compensation required to compensate for signal loss in said switches and said combiner.

9. A signal generator as claimed in claim 7 and wherein said tabulation is compiled at the time of manufacture of said generator.

10. A signal generator as claimed in claim 7 and wherein said tabulation is updated during use of said generator to compensate for variations in its characteristics.

11. A signal generator as claimed in claim 6 and wherein said control system is adapted to receive input data representative individually of the frequency and signal level required of at least one signal source, and data representative of the relative frequency and signal level requirements for a plurality of said signal sources.

12. A signal generator as claimed in claim 6 and wherein said control system is adapted to cause the generation of output signals at at least two output ports having a predetermined relationship with each other, and wherein the input of data relating to the characteristics of one output signal to the control system also causes the setting up of the other output signal.

13. A signal generator as claimed in claim 11 and wherein data is input to said control system via a keyboard.

14. A signal generator as claimed in claim 11 and wherein data is input to said control system via an external data bus.

15. A signal generator comprising a plurality of adjustable frequency signal sources mounted within a common enclosure; and a control system adapted to cause generation of output signals at at least two output ports having a selectable predetermined frequency and/or level relationship with each other, and wherein the input of data to the control system relating to the characteristics of one output signal also causes the setting up of the other output signal.

16. A signal generator as claimed in claim 15 and wherein a display is made available to indicate the relationship between the two output signals.

17. A signal generator as claimed in claim 16 and wherein said display is arranged to indicate the nature of the dependence of one output signal upon the other output signal as said other output signal is varied.

18. A signal generator as claimed in claim 16 and wherein said display is arranged to indicate in block digrammatic form the relationship between at least two output signals in terms of the routing of at least two signal sources.

19. A signal generator as claimed in claim 16 and wherein said display is arranged to indicate in graphical form the spectral relationship of the output signal in dependence upon the data which is input to said control system.

* * * * *